United States Patent
Chung et al.

(10) Patent No.: US 8,853,805 B2
(45) Date of Patent: Oct. 7, 2014

(54) STRAIN MEASUREMENT TEST MODULE

(75) Inventors: Jayhoon Chung, Plano, TX (US); Catherine Beth Vartuli, Richardson, TX (US); Guoda Lian, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 453 days.

(21) Appl. No.: 13/169,987

(22) Filed: Jun. 27, 2011

(65) Prior Publication Data

US 2012/0325009 A1    Dec. 27, 2012

(51) Int. Cl.
  G01L 1/00    (2006.01)
  G01P 15/08   (2006.01)
  H01L 27/14   (2006.01)
  H01L 21/66   (2006.01)
  G01B 15/06   (2006.01)
  G01B 7/16    (2006.01)

(52) U.S. Cl.
  CPC  *G01B 7/16* (2013.01); *H01L 22/12* (2013.01); *G01B 15/06* (2013.01); *H01L 22/34* (2013.01)
  USPC ........... 257/417; 257/414; 73/862.68; 73/777

(58) Field of Classification Search
  USPC ............... 257/E31.032, 414, 365, 369, 417; 29/846; 438/199; 73/862.68, 777
  See application file for complete search history.

(56) References Cited

U.S. PATENT DOCUMENTS

| | | | |
|---|---|---|---|
| 2005/0224798 A1* | 10/2005 | Buss | 257/65 |
| 2006/0226559 A1* | 10/2006 | Mehrotra et al. | 257/E21.547 |
| 2007/0004118 A1* | 1/2007 | Varghese et al. | 438/199 |
| 2007/0015347 A1* | 1/2007 | Mehta et al. | 438/514 |
| 2010/0052064 A1* | 3/2010 | Lo et al. | 257/369 |
| 2011/0127627 A1* | 6/2011 | Hoofman et al. | 257/431 |
| 2012/0025315 A1* | 2/2012 | Kronholz et al. | 257/365 |
| 2013/0243655 A1* | 9/2013 | Li et al. | 422/82.05 |

* cited by examiner

*Primary Examiner* — Lisa Caputo
*Assistant Examiner* — Jonathan Dunlap
(74) *Attorney, Agent, or Firm* — Jacqueline J. Garner; Frederick J. Telecky, Jr.

(57) ABSTRACT

A test structure for measuring strain in the channel of transistors. A method of correlating transistor performance with channel strain.

18 Claims, 5 Drawing Sheets

FOURIER TRANSFORM

STRAIN MEASUREMENT TEST MODULE

FIELD OF THE INVENTION

This invention relates to the field of test structures for integrated circuits. More particularly, this invention relates to test structures for the measurement of strain in the channel of transistors.

BACKGROUND OF THE INVENTION

As transistors in integrated circuits scale to smaller and smaller dimensions, transistor performance is not keeping pace. One method to improve transistor performance is to apply stress to the transistor channel region to enhance carrier mobility. For example, tensile stress may be applied to the channel of an NMOS transistor to enhance electron mobility and compressive stress may be applied to the channel of a PMOS transistor to enhance hole mobility.

For strained device development and for the control of strain in manufacturing routine measurements of the local strain tensor in the channel region need to be made. Some of the more commonly used strain measurement methods include nano-beam diffraction (NBD), convergent beam electron diffraction (CBED), and geometric phase analysis (GPA).

A cross section of a PMOS transistor 1000 with the silicon in the source and drain areas 1004 and 1010 replaced with germanium doped silicon (SiGe) is shown in FIG. 1. Since germanium is a bigger atom than silicon, compressive strain is applied to the channel region 1002 under the transistor gate 1006. Stress enhancement techniques such as the deposition of overlying highly stressed films may be used to apply additional stress to the channel region.

In the callout 1008 in FIG. 2, the larger lattice constant of the SiGe in the source and drain areas 2006 and 2008 applies compressive stress in the transistor channel region 2004 forcing the silicon atoms to be closer together in this region than in an unstrained region such as the region 2002 below the channel.

A high-resolution, high-angle annular dark field scanning transmission electron microscopy (HAADF-STEM) image of a PMOS transistor with SiGe source and drains is shown in FIG. 3. SiGe source and drains 3006 and 3008 are formed on either side of the transistor channel 3004 which underlies the transistor gate 3010. Single crystal silicon far below the transistor 3002 is essentially unstrained 3002 whereas silicon in the channel region 3004 may be highly strained.

As shown in FIGS. 4 and 5, in nano-beam diffraction (NBD) a collimated electron beam is scattered off the atoms in the sample 4006 forming a diffractogram such as in FIG. 5 after passing though objective lens 4004. The beam size of NBD may be in the range of 0.5 to 5 nm so the stress may be measured in the channel region of transistors with a channel length of about 5 nm or larger. Typically one diffractogram is taken in the strained channel region 3004 of a transistor and a second defractogram is taken in the unstrained single crystal region below the transistor channel 3002. The position of the diffraction points in the two diffractograms is compared. The amount of displacement of the points due to the compress stress may be related to the strain. Alternatively scan line data may be taken with many spots across the length of the channel and compared to an unstrained reference spot below the channel. In this way changes in the strain profile across the channel may be measured. NBD has a resolution of about 3 nm to 5 nm and a sensitivity for strain measurement of about 0.1%.

As shown in FIGS. 6 and 7, in convergent beam electron diffraction (CBED), a convergent beam of electrons 5010 is scattered off the atoms in the sample 5006 forming a diffractogram of disks as shown in FIG. 7, after passing through objective lens 5004. High-order Laue zone (HOLTZ) lines of the diffractogram of a strained region 3004 is compared with those of the diffractogram of an unstrained region 3002 to determine the strain. CBED has limitation in spatial resolution due to sample tilt to get proper HOZL lines, but has an increased sensitivity for strain measurement of about 0.01%.

Geometric phase analysis (GPA) is illustrated in FIGS. 8, 9, and 10. The diffractogram in FIG. 9 is a Fourier transformed image of the high resolution HAADF-STEM image in FIG. 8. Information regarding strain in various portions of the high-resolution HAADF-STEM image is contained in the blurring of the points such as g0 and g1 in FIG. 9. The various components of the strain tensor may be calculated from these points and used to form plots of the strain at various points in the HAADF-STEM image. An example plot of the xx component of the strain tensor is shown in FIG. 10. The light color in the channel region 1052 indicates compressive strain, the darker color in the source and drain areas, 1054 and 1056, indicates tensile strain, and the medium color under the channel region 1050 indicates a region of low to no strain. GPA has the advantage of simultaneously measuring strain throughout the entire HAADF-STEM image with a sensitivity for strain measurement of about 0.1% and resolution of about 2-4 nm.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

A test structure for measuring strain in the channel of transistors. A method of correlating transistor performance with channel strain.

DETAILED DESCRIPTION

Figure 1:
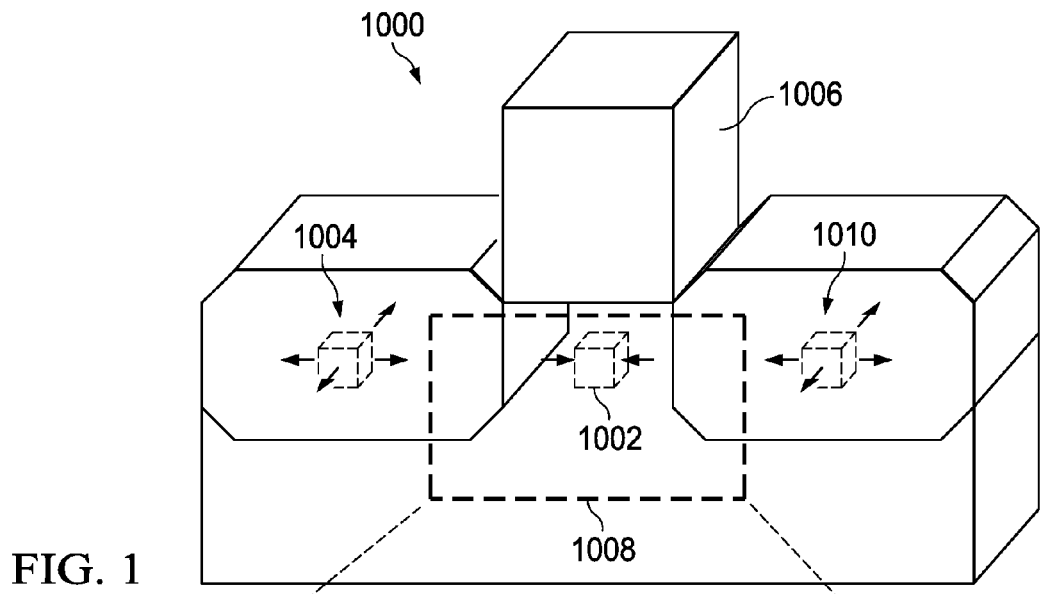
FIG. 1 is an illustration of a PMOS transistor with SiGe in the source and in the drain applying compressive stress to the channel region.
Figure 2:
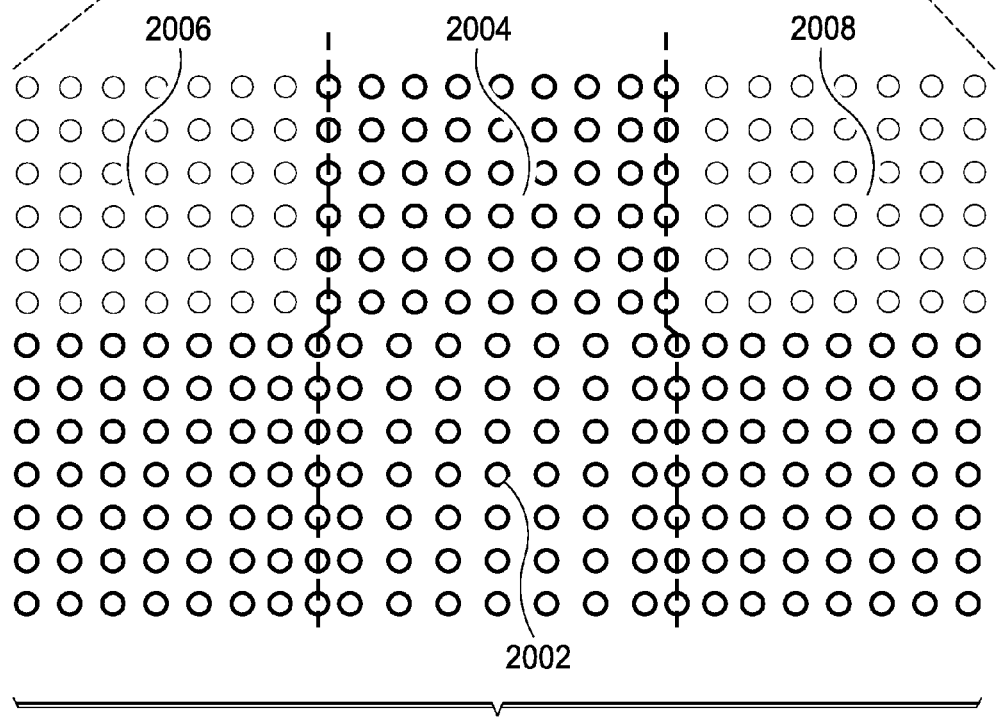
FIG. 2 illustrates lattice deformation of crystal planes due to stress.
Figure 3:
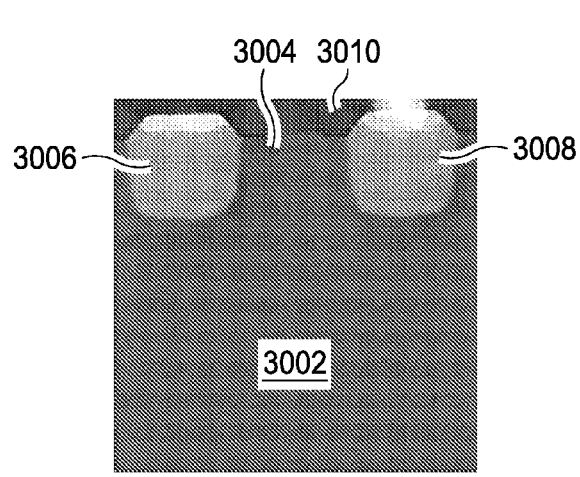
FIG. 3 is a high resolution HAADF-STEM image of a PMOS transistor with SiGe source and drains.
Figure 4:
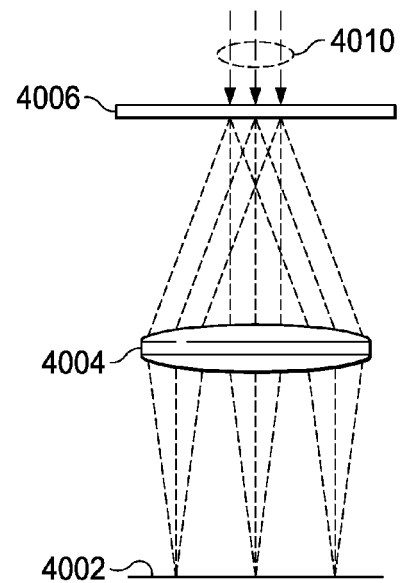
FIG. 4 illustrates nano-beam diffraction (NBD)
Figure 5:
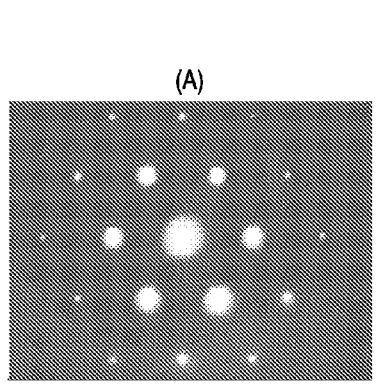
FIG. 5 is a diffractogram produced with NBD.
Figure 6:
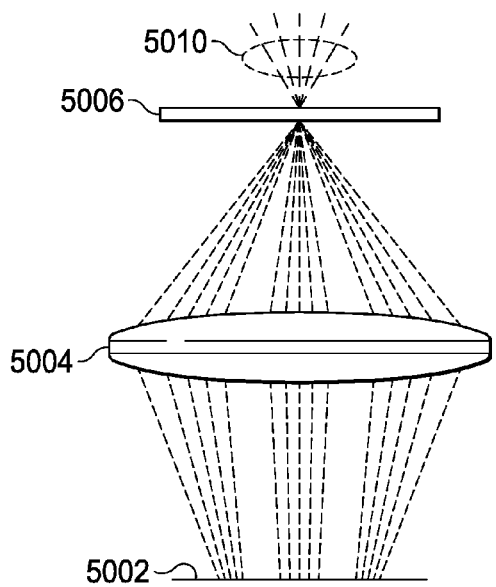
FIG. 6 illustrates convergent beam electron diffraction (CBED).
Figure 7:
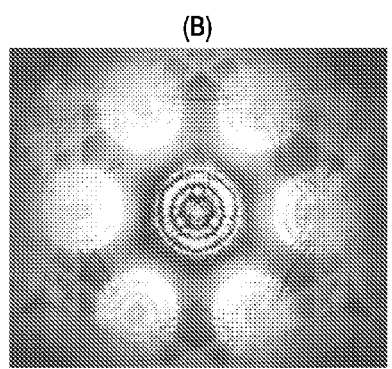
FIG. 7 is a diffractogram produced with CBED.
Figure 8:
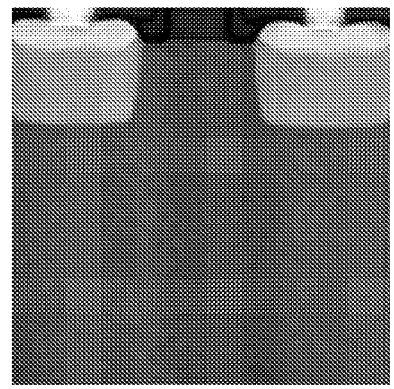
FIG. 8 is a high resolution scanning transmission electron micrograph (HRSTEM) of a PMOS transistor with SiGe source and drains.
Figure 9:
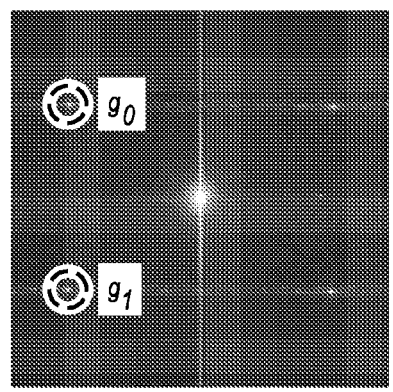
FIG. 9 is the Fourier transform on the HRSTEM image of FIG. 8.
Figure 10:
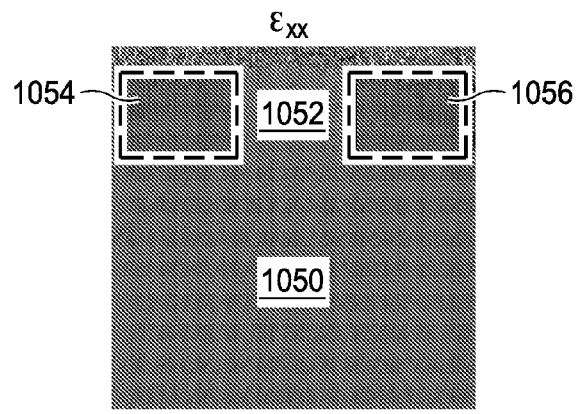
FIG. 10 is a typical PMOS strain plot produced using geometric phase analysis (GPA) of the Fourier transform similar to FIG. 9.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

For development and optimization of transistor performance enhancement using strain and also for control of strain enhancement processes in manufacturing routine measurements of the local strain tensor in the channel region need to be made. Typically a transistor with a channel region of sufficient length to accommodate the strain measurement technique being used is selected and the sample for strain measurement is prepared by cross sectioning through the transistor and then thinning the sample to the required thickness using focused ion beam (FIB) or ion milling (IM). As the sample thickness is reduced too thin, stress relaxation begins to occur so the strain measured on thin samples may be too low. As the sample thickness is increased too thick, the signal may degrade reducing the sensitivity of the strain measurement. To get the best comparison of strain measurements when comparing process-to-process or wafer-to-wafer or to be able to monitor strain from wafer-to-wafer, lot-to-lot, and device-to-device in manufacturing a standard test structure for strain measurements is desirable.

Figure 11:
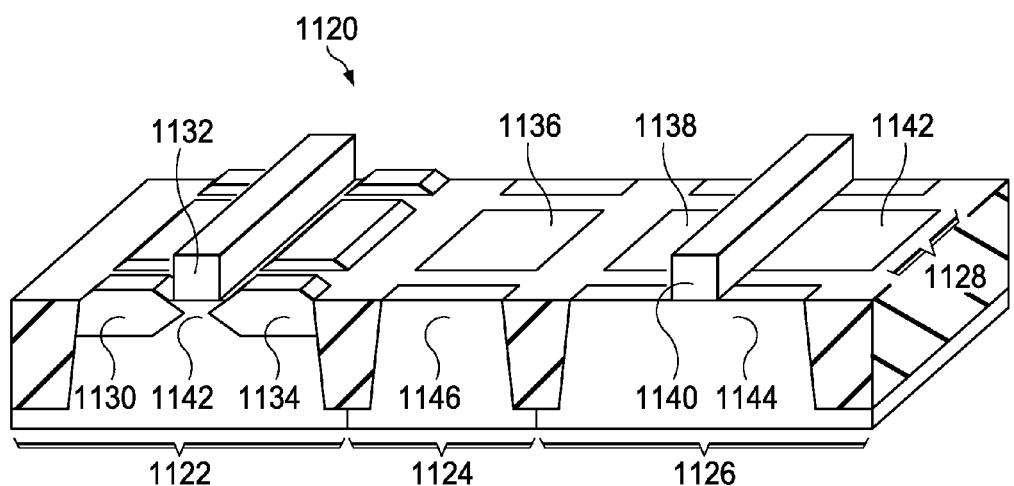
FIG. 11 is an illustration of a strain test structure according to an embodiment.

An embodiment test structure for reproducible strain measurements is illustrated in FIG. 11. The test structure includes a PMOS transistor region 1122, an NMOS transistor region 1126, and a region for measuring unstressed single crystal wafer material 1124. To illustrate the embodiment a PMOS transistor 1122 with SiGe source and drains 1130 and 1134 is used. A PMOS transistor without SiGe source and drains or with stress liner or stress memorization mobility enhancement may also be used. Similarly an NMOS transistor 1126 with single crystal silicon source and drains 1138 and 1142 is used. An NMOS transistor with SiC source and drains or another form of mobility enhancement such as stress liner or stress memorization may also be used.

The width of the transistors 1128 may be between 180 nm and about 300 nm to provide an optimal target thickness for strain measurement using such techniques as NBD, CBED, and GPA. In an example embodiment the width is about 200 nm. The width is chosen as the best compromise between stress relaxation and signal degradation. This embodiment test structure significantly facilitates sample preparation by providing a structure that may be readily located and also by providing structures with optimum sample thickness to facilitate sample preparation using a focused ion beam (FIB). In addition using an identical structure for the strain measurements on different samples, eliminates variation in the strain measurements that could be the result of structural differences significantly improving the accuracy of the sample-to-sample strain comparison.

The PMOS and NMOS transistor test structures, 1122 and 1126, may be core logic transistors formed using minimum design rules for use with strain measurement techniques such as NBD and GPA. Additionally, the PMOS and NMOS transistor test structures, 1122 and 1126, may be transistors with channel lengths 1142 and 1144 of greater than about 80 nm for CBED, NBD, or GPA measurements. In an example embodiment the width of channel lengths 1142 and 1144 to be used for CBED measurements is about 100 nm. The transistor regions may be prepared using the same process flow as is used for the integrated circuit transistors. In an example embodiment, embodiment test structures with core transistor channel lengths, with 100 nm transistor channel lengths and with at least one intermediate channel length transistor are placed on the wafer.

Figure 12:
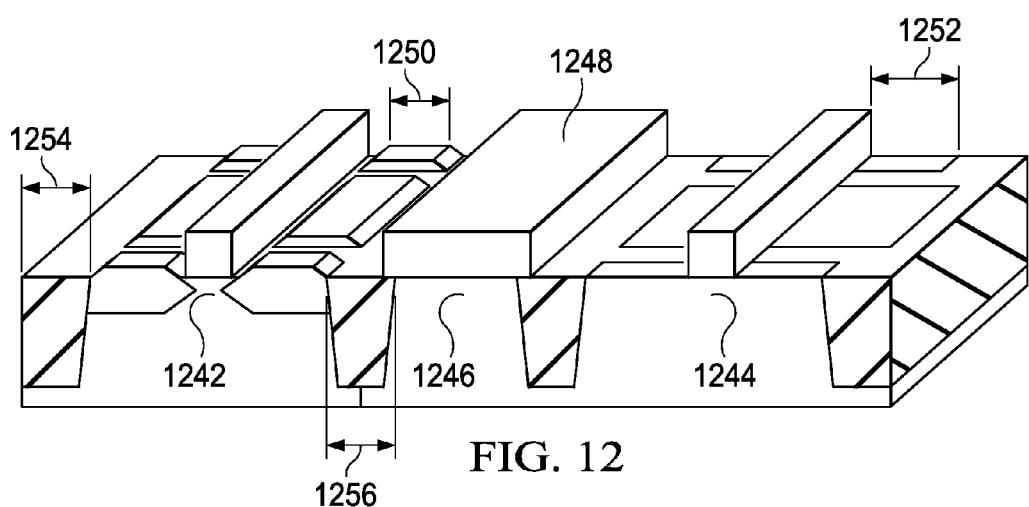
FIG. 12 is an illustration of a strain test structure according to an embodiment.

The unstressed reference region 1136 may be preferably greater than 80 nm in width so it may be used for CBED as well as NBD and GPA measurements. It may have pwell doping or nwell doping or both the nwell and pwell implants may be blocked from this area. In an example embodiment, both nwell and pwell implants are blocked from the reference strain region 1136. In addition, silicide formation may be blocked from the reference strain region 1136. If a silicide blocking mask is in the baseline manufacturing flow, this may be used without added processing steps or cost. If a silicide blocking mask is not in the baseline manufacturing flow, gate material 1148 may be used to cover the reference strain region 1146 as shown in FIG. 12.

Although core logic transistors are used to illustrate the embodiment, other transistor types such as high voltage or analog transistors may also be used. Since these test structures occupy little area, multiple strain measurement test structures, one for each transistor type on the integrated circuit may be used.

In addition, for development, it may be desirable to place test structures with multiple channel lengths (1242, and 1244), multiple source and drain widths (1250 and 1252), and multiple shallow trench isolation (STI) widths (1254 and 1256), to calibrate a strain modeling tool as a function of these variables. In addition, strain test structures with and without overlying stress layers, with and without stress memorization, and with and without SiGe or SiC source and drains may be placed on the same wafer to better determine the improvement these stress techniques provide.

Figure 13:
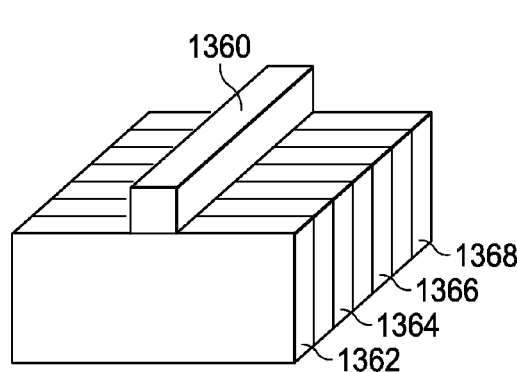
FIG. 13 is an illustration of a strain test structure according to an embodiment.

As illustrated in FIG. 13, a number of test structures may be stacked under one gate 1360 with test structure widths 1362, 1364, 1366, and 1368 either the same or with widths varying between about 180 nm and about 300 nm. In this way a sample with a more optimal thickness may be easily located and prepared if needed. In an example embodiment, a stacked strain test structure with target widths of 190 nm, 200 nm, 210 nm, 220 nm, and 240 nm are used.

Figure 14:
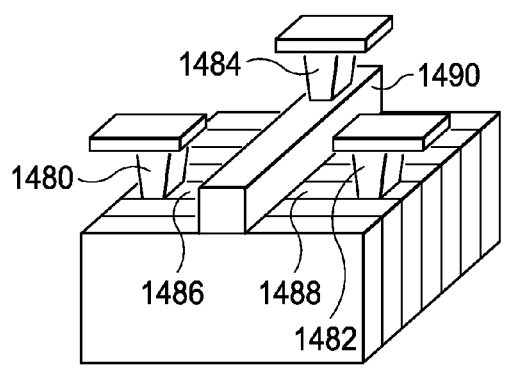
FIG. 14 is an illustration of a strain test structure according to an embodiment.

As is illustrated in FIG. 14, these strain test structures may also be probed electrically if desired. Contacts 1480, 1482, and 1484 may be formed to the source 1486, drain 1488, and gate 1490 of the strain test structure NMOS and PMOS transistors. In this way transistor performance may be measured and correlated directly with the strain measured in the channel of the same transistor. This may significantly improve the calibration of software programs that model the carrier mobility versus stress in the transistor channel.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A strain test structure for measuring transistor channel strain, comprising:
   a transistor with a width between about 180 nm and 300 nm disposed on a wafer;
   an unstressed reference region of said wafer with a width equal to said width of said transistor; and
   a plurality of transistor test structures under the same gate of said transistor separated from each other by an STI region.

2. The test structure of claim 1 where said transistor is a PMOS transistor.

3. The test structure of claim 1 where said transistor is a NMOS transistor.

4. The test structure of claim 1 where said transistor is a NMOS transistor and a PMOS transistor.

5. The test structure of claim 1 where said width is about 200 nm.

6. The test structure of claim 1 with a first width of said plurality of transistor test structures is about is about 200 nm and with a second width of said plurality of transistor test structures that is greater than about 200 nm and less than about 300 nm.

7. The test structure of claim 1 with a silicide blocked from said unstressed reference region.

8. The test structure of claim 1 where NMOS and PMOS well implants are blocked from said unstressed reference region.

9. The test structure of claim 1 where a length of said transistor is a core transistor length.

10. The test structure of claim 1 where a length of said transistor is greater than about 80 nm.

11. The test structure of claim 1 further comprising:
    a first transistor with a channel length equal to a core transistor channel length;
    a second transistor with a channel length greater than about 80 nm; and
    a third transistor with a channel length greater than a core transistor channel length and less than about 80 nm.

12. The test structure of claim 1 further comprising:
    electrical contact to a source of said transistor;
    electrical contact to a drain of said transistor; and
    electrical contact to a gate of said transistor.

13. A strain test structure for measuring transistor channel strain, comprising:
    a PMOS transistor;
    a NMOS transistor;
    an unstressed reference region, where a width of said NMOS transistor, said PMOS transistor, and said unstressed reference region is in the range of about 180 nm to 300 nm; and
    a plurality of strain test structures with multiple widths under a common gate of said PMOS transistor and under a common gate of said NMOS transistor where said multiple widths are separated from each other by an STI region.

14. The test structure of claim 13 where a first of said multiple widths is about 200 nm and where a second of said widths is between about 200 nm and 300 nm.

15. A strain test structure for measuring transistor channel strain, comprising:
    an unstressed reference region;
    a first PMOS transistor and a first NMOS transistor with a channel length equal to a core transistor length; and
    a second PMOS transistor and a second NMOS transistor with a channel length greater than about 80 nm, where a width of said first NMOS transistor, said second NMOS transistor, said first PMOS transistor, said second PMOS transistor, and said unstressed reference region is in the range of about 180 nm to 300 nm.

16. The test structure of claim 15 where nwell and pwell implants are blocked from said unstressed reference region.

17. The test structure of claim 15 where silicide is blocked from said unstressed reference region.

18. A method of correlating transistor performance with transistor channel strain, comprising:
    providing a first strain test structure with a first channel strain in a first transistor;
    providing a second strain test structure with a second channel strain in a second transistor where a channel length of said first transistor is the same as a channel length of said second transistor;
    measuring a first drive current on said first transistor;
    measuring a second drive current on said second transistor;
    measuring a first strain on said first transistor;
    measuring a second strain on said second transistor; and
    correlating a difference in said first strain and said second strain with a difference in said first drive current and said second drive current.

* * * * *